US006979639B2

(12) United States Patent
Heath et al.

(10) Patent No.: US 6,979,639 B2
(45) Date of Patent: Dec. 27, 2005

(54) METHOD FOR LITHOGRAPHIC PROCESSING ON MOLECULAR MONOLAYER AND MULTILAYER THIN FILMS

(75) Inventors: James R. Heath, Los Angeles, CA (US); Charles P. Collier, Los Angeles, CA (US); Yi Luo, Los Angeles, CA (US); Erica DeIonno, Los Angeles, CA (US); Patricia A. Beck, Palo Alto, CA (US)

(73) Assignees: California Institute of Technology, Pasadena, CA (US); Hewlett-Packard Development Co., L.P., Houston, TX (US)

( * ) Notice: Subject to any disclaimer, the term of this patent is extended or adjusted under 35 U.S.C. 154(b) by 0 days.

(21) Appl. No.: 10/803,119

(22) Filed: Mar. 16, 2004

(65) Prior Publication Data

US 2004/0175595 A1 Sep. 9, 2004

Related U.S. Application Data

(62) Division of application No. 10/015,063, filed on Dec. 11, 2001, now Pat. No. 6,756,296.

(51) Int. Cl.⁷ .......................................... H01L 21/4763
(52) U.S. Cl. ..................................... 438/622; 438/623
(58) Field of Search ......................... 438/622; 257/300

(56) References Cited

U.S. PATENT DOCUMENTS 6,026,013 A * 2/2000 Peterson ..................... 365/175

| 6,128,214 | A | 10/2000 | Kuekes et al. |
| 6,159,620 | A | 12/2000 | Heath et al. |
| 6,198,655 | B1 | 3/2001 | Heath et al. |
| 6,458,621 | B1 * | 10/2002 | Beck .......................... 365/151 |

OTHER PUBLICATIONS

C.L. Brown et al., "Introduction of [2]Catenanes into Langmuir Films and Langmuir-Blodgett Multilayers. A Possible Strategy for Molecular Information Storage Materials," *Langmuir* 2000, 16, 1924-1930.
T. Deng et al., "Prototyping of Masks, Masters, and Stamps/Molds for Soft Lithography Using an Office Printer and Photographic Reduction," *Anal. Chem.* 2000, 72, 3176-3180.
S.Y. Chou et al., "Sub-10 nm imprint lithography and applications," *J. Vac. Sci. Technol. B* 15(6), Nov./Dec. 1997, 2897-2904.
C.P. Collier et al., "A [2]Catenane-Based Solid State Electronically Reconfigurable Switch," *Science* 2000, 289, 1172-1175.

* cited by examiner

Primary Examiner—Thao P. Le
(74) Attorney, Agent, or Firm—Shapiro & Dupont LLP (57) ABSTRACT

Methods for making electronic devices where a molecular monolayer or multilayer is sandwiched between top and bottom electrodes at electrode intersections. The molecular layer has an electrical characteristic such as bistable switching. A layer of electrically conductive material is used to protect the molecular layer during formation of the top electrode pattern. The electrically conductive material remains sandwiched between the top and bottom electrodes at the electrode intersections in the final electronic device.

13 Claims, 7 Drawing Sheets

METHOD FOR LITHOGRAPHIC PROCESSING ON MOLECULAR MONOLAYER AND MULTILAYER THIN FILMS

This application is a DIV of Ser. No. 10/015,063 filed on Dec. 11, 2001 now U.S. Pat. No. 6,756,296

This invention was made with Government support under Contract No. DABT63-9-3-0003, awarded by the U.S. Army. The Government has certain rights in this invention.

BACKGROUND OF THE INVENTION

1. Field of the Invention

The present invention relates generally to molecular electronic devices that can be utilized for memory storage, logic circuitry or signal routing. More specifically, the present invention relates to improved methods for making such devices wherein the critical dimensions of the devices are measured in nanometers.

2. Description of Related Art

Molecular electronic devices have been demonstrated to be capable of performing many of the same tasks that are commonly performed by semiconductor (e.g. silicon, gallium arsenide, etc.) devices. These tasks include signal rectification, signal switching and simple logic functions. Such devices are described in: "Molecular Wire Crossbar Logic" (U.S. Ser. No. 09/282,045); "Molecular Wire Crossbar Interconnect" (U.S. Ser. No. 09/280,225); "Demultiplexer for a Molecular Wire Crossbar Network" (U.S. Ser. No. 09/282,049); "Chemically Synthesized and Assembled Electronic Devices" (U.S. Ser. No. 09/292,767); and "Electrically Addressable Volatile and Non-Volatile Molecular Based Switching Devices (U.S. Ser. No. 09/459,246). Molecular electronic devices are also described in U.S. Pat. Nos. 6,128,214 and 6,159,620.

An advantage of molecular electronic devices is that the device performance characteristics originate from molecular properties. This has several implications. First, it means that the devices can potentially scale down in size to nanometer dimensions without significant change in device performance. Second, it also means that the unique electronic properties that can be designed into molecular structures can also be designed into solid state devices. These advantages are not characteristic of semiconductor devices. However, many molecular electronic devices that have been fabricated to date involve fairly awkward device processing steps. As one example of this awkward processing, electrical connections to the molecules are often evaporated through contact shadow masks, meaning that a thin metal foil that has been previously patterned with holes of various shapes is placed in contact with the molecular thin film and metal electrodes are deposited by directing a metal vapor through the open pattern. This technique has serious limitations in terms of the size resolution and complexity of electrode patterns that can be deposited. For example, it is very difficult and expensive to fabricate shadow masks that have patterned features that are smaller than a couple of micrometers in size.

As a second example of the current art that is utilized for molecular electronic devices, a nanometer scale wire is defined using electron beam lithography and great effort is made to fabricate a wire that has a very thin cross-section. The wire is then "broken" in a manner similar to how a fuse is blown. Under appropriate conditions, the broken junction can be designed to have a gap that is of molecular dimensions, so that molecules can be chemically attached to bridge across the junction. Once again, while it is possible to make electrical contact to the molecules in this way, the device processing steps are just awkward, and the performance characteristics of such a device are difficult to reproduce across many devices.

Nevertheless, the above-described procedures have been developed because, while at thin film of organic molecules may have desirable characteristics for electronic device applications, it is also an inherently delicate film. This is because such a film may melt, flow, or be otherwise damaged by low-temperature processing steps such as the spin-coating of a photolithographic resist materials. A set of processing techniques for dealing with such films have not been developed. It would be desirable to provide improved processing techniques that would eliminate the problems associated with existing processing technology and allow the production of molecular electronic devices having electrode patterns with nanometer scale dimensions.

DEFINITIONS. The following definitions apply to the present invention:

"Mol-RAM" in this context refers to molecular-switch based array of memory cells.

"Molecular electronic devices" in this context refers to devices in which some critical component of the device, such as the wire or the switch, is a molecule or a collection of molecules.

A "memory bit" in this context refers to a physical device that can exist in two states ('0' or '1') that can be distinguished from one another by electrically probing the device.

"Lithographic processing" in this context refers to any procedure in which light or electron beams are used to produce a chemically or materially differentiated pattern onto a substrate.

A "switch" in this context refers to a physical device that can switch between two states, such as 'open' and 'closed,' and the difference between the two states can be probed electrically. The difference between the two states of a switch is typically greater than for a memory bit. For example, if the electrical property that is measured to determine the state of the switch is the resistance of the device, then a memory bit may be characterized by a 20% change in resistance, while a switch may be characterized by a 200% change in resistance. A switch can be used as a memory bit, but a memory bit may not necessarily be useful as a switch.

"Self-assembled" in this context refers to a system that naturally adopts some geometric pattern because of the identity of the components of the system; the system achieves at least a local minimum in its energy by adopting this configuration. For example, a self-assembled molecular monolayer is a geometrically arranged monolayer film of molecules that is formed when certain molecules chemically bind to a certain surface. The organization of such a self-assembled monolayer is controlled by both the geometric registry of the molecules with the atomic structure of the underlying surface, as well as the interactions between neighboring molecules in the monolayer.

"Singly configurable" in this context means that a switch can change its state only once via an irreversible process such as oxidation or reduction reaction; such a switch can be the basis of a programmable read only memory (PROM), for example.

"Reconfigurable" in this context means that a switch can change its state multiple times via a reversible process such as an oxidation or reduction; in other words the switch can be opened and closed multiple times, e.g., the memory bits in a random access memory (RAM).

A "crosspoint memory" in this context means a memory circuit that consists of a grid of crossed wires. At each junction of the grid is a memory bit, in which some material, such as switching molecules, are sandwiched between the electrodes. The '0' or '1' state of the memory bit may be set electrically, and that state of the memory bit may be probed electrically. The electrical setting or probing of the bit is carried out by electrically addressing the two wires of the crosspoint memory that form the intersection.

"Redox active" in this context means that a molecule or molecular junction can be electrochemically reduced or oxidized, meaning that electrical charge can be added or taken away from the molecules or molecular junction.

A "wetting film" in this context refers to a film that completely and uniformly covers another film. This term does not imply that the wetting film is liquid, it only refers to how the wetting film coats an underlying substrate. If a top material does not uniformly wet a bottom material, then that top material will instead form islands and patches of coverages.

"Micron-scale dimensions" refers to dimensions that range from 1 micrometer to a few micrometers in size.

"Sub-micron scale dimensions" refers to dimensions that range from 1 micrometer down to 0.04 micrometers.

"Nanometer scale dimensions" refers to dimensions that range from 1 nanometers up to 50 nanometers (0.05 micrometers).

"Micron-scale wires" and "submicron-scale wires" refers to rod or ribbon-shaped conductors of semiconductors with widths or diameters having the dimensions of 1 to 10 micrometers, heights that can range from a few tens of nanometers to a micrometer, and lengths of several micrometers and longer.

"Hysteresis" in this context refers to the character of a current-voltage measurement such that the forward voltage trace (negative to positive voltage) is characterized by a different current flow than the reverse voltage trace (positive to negative voltage). $V_{LH}$ refers to the low voltage end of the hysteresis loop, and $V_{HH}$ refers to the high voltage end of the current loop. $V_{MH}$ is a voltage value somewhere between $V_{LH}$ and $V_{HH}$.

"Non-destructive read" in this context refers to the operation of a memory cell such that the information in the cell can be read out (accessed) without affecting the status of the memory bit.

A "short" or a "shorted device" in this context refers to an unintended fixed electrical connection between various components of a device, or between various devices.

A "circuit" in this context refers to several interconnected devices that together perform some task, such as a logical operation, memory storage, or signal routing.

SUMMARY OF THE INVENTION

In accordance with the present invention, a method is provided for making molecular electronic devices which is an improvement over existing fabrication techniques. The method is suitable for producing molecular electronic devices where the various electronic structures have micron to submicron to nanometer scale dimensions.

The method involves providing a substrate having a surface on which is located a first electrode pattern. Bistable switching molecules, or some other molecules with a desirable electronic characteristic, are deposited onto the substrate surface to form a molecular layer that covers the substrate surface including the first electrode pattern. As a feature of the present invention, an electrically conductive material is deposited onto the molecular layer to form an electrically conductive protective layer that serves to protect the underlying molecular layer. The protective layer allows one to use lithography or other conventional patterning techniques, such as stamping or imprinting, to form a second electrode pattern on the surface of the protective layer without damaging the underlying molecules. The ability to use lithography and other related patterning techniques makes it possible to fabricate complex circuit patterns and to form a second electrode pattern above the first that has dimensions that are only limited by the lithography or patterning approach.

The second electrode pattern in formed on the protective layer so that the second electrode pattern overlaps the first electrode pattern to form at least one electrode intersection. The protective layer is then removed at the locations which remain exposed after formation of the second electrode pattern to form at least one electrode intersection where the molecular switching layer and electrically conductive protective layer are sandwiched between the first and second electrode patterns. The electrically conductive protective layer at each intersection forms an integral part of the second electrode. Selective removal of the conductive protective layer from those areas that are not located under the second electrode pattern is necessary in order to limit electrical conductivity to the electrodes and electrode intersections. Without this step, an electrical short might exist between the top and bottom electrodes, and if a circuit has been fabricated, then the various devices within the circuit might also be shorted to one another.

The present invention is not only directed to a method for making molecular electronic devices, but also covers the devices themselves. Such devices include a substrate having a surface on which is located a bottom electrode pattern having an interior surface. A top electrode pattern having an interior surface is provided wherein the top electrode pattern overlaps said bottom electrode pattern to form at least one electrode intersection located between the interior surfaces of the first and second electrode patterns. Sandwiched between these two electrodes are two layers. The lower layer, which consists of molecules that have unique electrical properties, such as a bistable switching characteristic, is situated on top of the bottom electrode. The upper layer is an electrically conductive protective material, and this layer provides an interface between the molecular layer and the top electrode pattern. The resulting device includes one or more electrode intersections or switches wherein the molecules and electrically conductive protective material are sandwiched between the first and second electrode patterns.

The present invention also is directed to the intermediate assemblies that are fabricated during the various steps of the manufacturing process. For example, the invention covers the assembly prior to formation of the second electrode pattern on the electrically conductive protective layer. The assembly includes a substrate comprising a surface on which is located a first electrode pattern. A layer of molecules, such as bistable switching molecules, is provided which has been deposited onto the substrate surface to form a molecular layer that covers the substrate surface including the first electrode pattern. The assembly further includes a layer of electrically conductive material that has been deposited onto the molecular switching layer to form an electrically conductive protective layer. This protective layer has an exposed surface on which the second electrode pattern may be formed by lithograhy or other high resolution technique used for fabricating electrode patterns having dimensions that are limited only by the lithographic technique, and thus may be scaled to nanometer dimensions.

The above discussed and many other features and attendant advantages of the present invention will become better understood by reference to the following detailed description when taken in conjunction with the accompanying drawings.

DETAILED DESCRIPTION OF THE INVENTION

The method of the present invention is well suited for use in making a wide variety of molecular electronic devices wherein optical, electron or ion beam lithography is used to form the electrode patterns. The term electrode patterns as used herein refers to all types of electrically conductive structures used in molecular electronic devices including molecular switch tunnel junctions, molecular switch crosspoint memory circuits and molecular switch logic circuits.

The method allows one to use standard lithographic processing and other patterning techniques on a single monolayer film or a few-multilayer-thick film of molecules. The process must not destroy the desirable electrical characteristics of the molecular layer, and must enable the exploitation of the unique electrical properties of the molecules in a solid-state device. In general, the organic molecular films in question do not possess the material characteristics of semiconductor thin films for example, and this means that, unless special care is taken, certain lithographic processing steps may degrade the molecular monolayer of interest. For example, photoresist is often deposited onto a substrate via a technique known as spin coating. In that technique, the fluid photoresist, containing a spreading solvent, is applied on top of a wafer. The solvent evaporates, leaving a film of photochemically active resist material. This process is routinely carried out on both semiconductor and metallic thin films. However, if this process is carried out on a molecular thin film, it is possible and even likely that the solvent will disrupt or destroy the molecular thin film.

The present invention seeks to protect the molecular thin film from these and other processing steps by depositing a very thin, protective layer of a metal that wets and adheres to the molecular thin film, and makes a good electrical contact to the molecular film. All of the processing steps are subsequently carried out directly on this protective layer. After the lithographic processing has been completed and all wiring connections have been established, the protective layer is selectively removed via a selective wet or dry etching process.

Figure 1A:
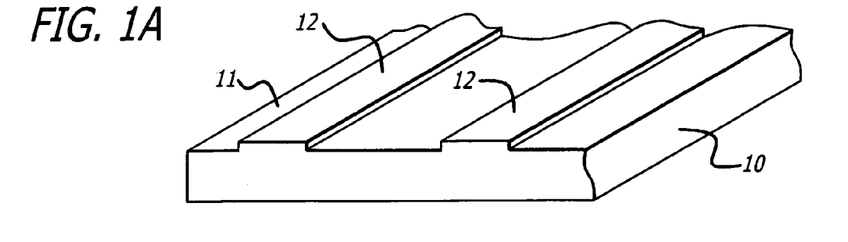
FIGS. 1A–1D are a schematic representation of the steps of the present invention involving: forming the molecular switching layer of bistable molecules on a first electrode pattern located on a substrate; forming a conductive protective layer on top of the switching layer; and applying a lithographic resist layer on top of the protective layer.
Figure 1B:
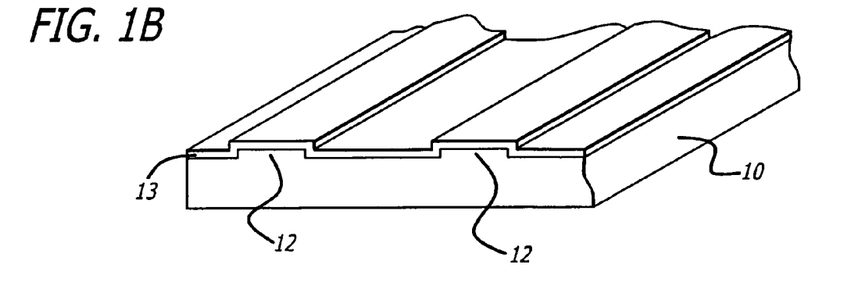
Figure 1C:
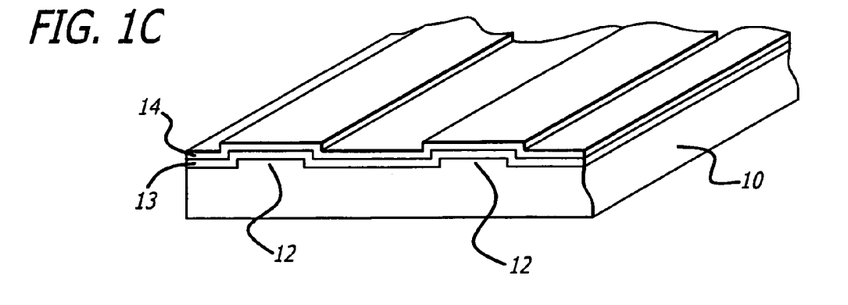
Figure 1D:
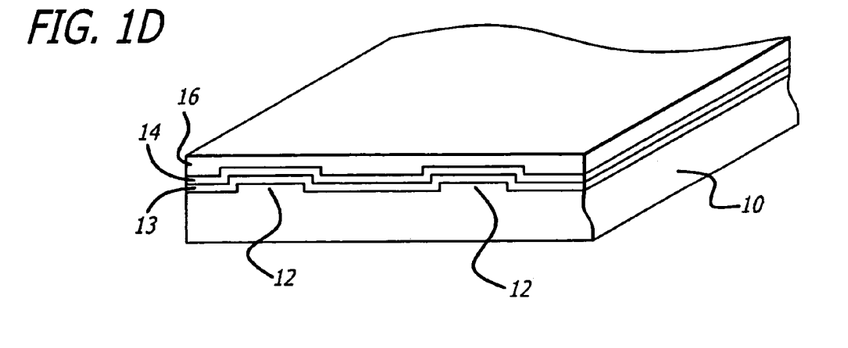
Figure 2A:
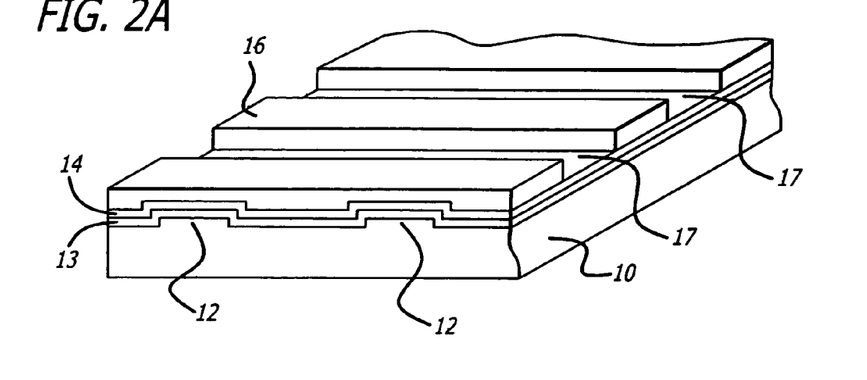
FIGS. 2A–2C are a schematic representation of further steps of the present invention involving: removing resist to define a second electrode pattern; depositing electrode material onto the protective layer as defined by the resist pattern; and removing the resist.
Figure 2B:
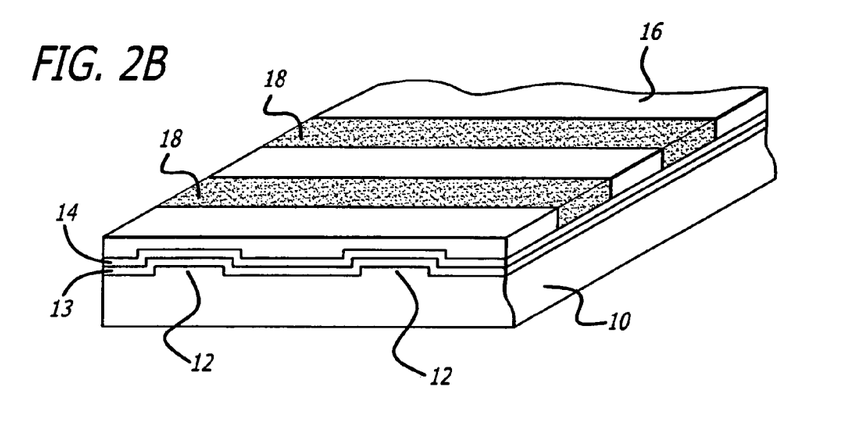
Figure 2C:
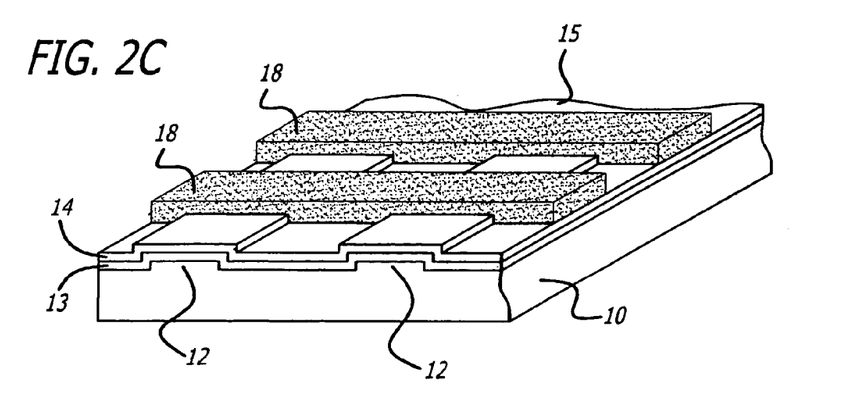
Figure 3:
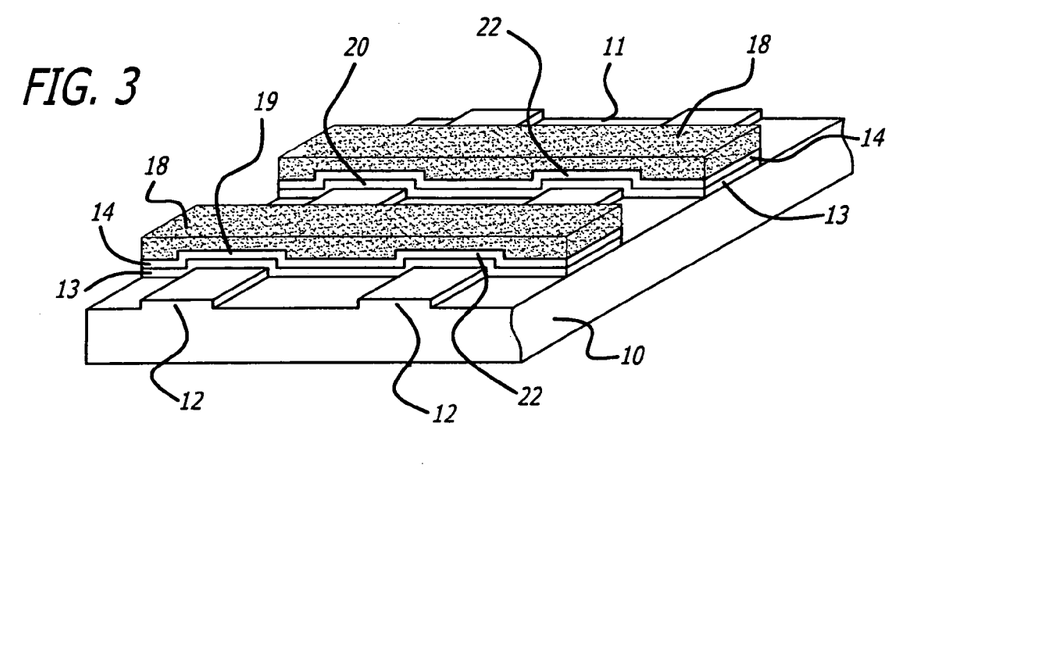
FIG. 3 is a schematic representation of the step of the invention involving removing the protective layer from those areas not underlying the second electrode pattern to form a simple molecular electronic device in accordance with the present invention.

Referring to FIGS. 1–3, an exemplary method is diagrammatically set forth for making a molecular electronic device in accordance with the present invention. As shown in FIG. 1 at A, electrodes 12 have been patterned on an insulated substrate 11. The insulated substrate 11 includes a substrate and an insulating device that is covered with a conducting material from which the bottom electrodes 12 can be patterned. The substrate can be made from any number of conducting or insulating materials, including silicon nitride, sapphire, silicon dioxide in the form of glass or quartz, silicon, gallium arsenide, or polymeric materials. The insulating surface or film on which electrodes 12 are patterned must be insulating. If the substrate is insulating, then the same material can be used to form the insulating film. If the substrate is conducting, such as would be the case for a silicon wafer, then the film must be insulating to prevent electrical connection of final devices to the underlying substrate. On top of insulated substrate 11 is deposited a conducting film from which are patterned the bottom electrodes 12. Patterning techniques can range from optical and electron-beam lithography to various imprinting techniques that are known from the literature. Once the bottom electrodes 12 are defined, a molecular layer or film 13 is deposited. The film 13 may be deposited over the entire wafer (see FIG. 1 at B).

The molecular film 13 must coat the surface of the bottom electrodes 12, but it can also coat the rest of the substrate surface 11. The molecules in the molecular layer 13 are designed to yield a specific electrical characteristic, such as bistable switching, charge storage (capacitors), signal rectification (diodes), signal dissipation (resistors) or signal inversion (negative differential resistance). The molecular layer 13 is preferably deposited as a single layer of molecules or as a layer that is only a few molecules thick. As a feature of the present invention, an electrically conductive material is deposited onto the molecular layer 13 to form an electrically conductive protective layer 14 (see FIG. 1 at C). The molecular may be deposited as a Langmuir film or Langmuir-Blodgett multilayer (see C. L. Brown et al., "The Introduction of [2]Catenanes Into Langmuir Films and Langmuir-Blodgett Multilayers—A Possible Strategy For Molecular Information Storage Materials," *Langmuir*, 2000 Feb. 22, V16 N4:1924–1930.). The molecules may also be deposited via a chemical reaction that bonds some part of the molecule with the electrodes 12. The molecular layer 13 will preferably be on the order of 1 nanometers to 10 nanometers thick and can be made from a wide variety of bistable switching molecules including rotaxanes, pseudorotaxanes, catenanes, spiropyrans, and other bistable molecular structures.

The electrically conductive protective layer 14 may be made from any suitable electrically conductive material which is capable of uniformly wetting the molecular layer 13 to form a thin protective film. Preferred exemplary metals are titanium and chromium. Various other metals and metal alloys may be used provided that they are capable of conducting electricity and providing a uniform thin film 14 on top of the molecular layer 13 without damaging or otherwise adversely affecting the electrical properties (such as bistable switching) molecular film 13. Metals and metal alloys that form strong metal-carbon chemical bonds, such as titanium, chromium, zirconium, niobium, and others are likely to be excellent candidates for the protective film. Metals that form weak metal-carbon chemical bonds are likely to be poor candidates. This protective layer 14 will later be removed, and so it is important for it to be as thin as possible, while still existing as a film that uniformly coats the molecular layer 13.

The next step involves forming a second electrode pattern on the exposed surface of the protective layer 14. A second set of options is to use patterning techniques that, while not as conventional, are also well-developed, and those patterning techniques include stamping (Deng, T; Wu, H K; Brittain, S T; Whitesides, G M. "Prototyping of masks, masters, and stamps/molds for soft lithography using an office printer and photographic reduction." *ANALYTICAL CHEMISTRY*, 2000 Jul. 15 V72 N14:3176–3180.) and imprint techniques (Chou, S Y; Krauss, P R; Zhang, W; Guo, L J; and others, "Sub-10 nm imprint lithography and applications," *JOURNAL OF VACUUM SCIENCE & TECHNOLOGY B*, 1997 November–December, V15 N6:2897–2904). Such procedures involve forming a masking, electron beam resist, or photoresist layer 16 that entirely covers the electrically conductive protective layer 14 (see FIG. 1 at D). The layer 16 can be any of the known resist materials that are typically applied by spin casting or of any of the polymeric materials that can be utilized for stamping or imprinting. The resist layer 16 will range in thickness from 50 nanometers to 2 microns, as is required by established lithographic process techniques. Portions of the layer 16 are removed by the preferred writing technique to form electrode locations 17 (see FIG. 2 at A). Using preferred lithographic techniques and an optimized resist layer thickness, the electrode location 18 can be accurately made to nanometer scale dimensions.

The next step in lithographic formation of the second electrode pattern involves depositing electrode material 18 into the electrode locations 17 (see FIG. 2 at B). Many known deposition techniques may be utilized, although there is a general requirement, based on the stability of molecular materials in layer 13, that the deposition process not require temperatures in excess of 150 to 200° C. There may be some exceptions to this requirement, because there are certain molecular materials that are stable at temperatures up to 400° C. However, that is not typical. Electron-beam evaporation, or sputtering deposition are suitable techniques for depositing the electrode material 18. Suitable electrode materials include metals such as aluminum, copper, gold, platinum, palladium, nickel, silver, cobalt, tin, iron and alloys thereof. Suitable electrode materials also include semiconductors such as amorphous silicon, silicon, polysilicon, gallium arsenide, or conducting doped polymers such as appropriately doped poly(metaphenylenevinylene). It may be necessary to sequentially deposit two conducting materials to form the top electrodes 18, whereby the first material promotes adhesion of the second material. Titanium is often used for this application. The fundamental limitation of the thermal stability of the molecular film 13 implies that top electrode materials such as crystalline or polycrystalline silicon, for example, are not appropriate, since such films typically require high temperature processing. Preferably, the second or top electrodes 18 will be 20 nanometer thick or thicker. As previously mentioned, a crossbar structure of electrode patterns is shown, but other devices and circuit geometries are possible, including electrode patterns that can form a highly complex pattern.

The resist layer 16 is removed using solvents or any other known lithographic techniques for removing resist layers that will not destroy the desired device stack (see FIG. 2 at C). As can be seen, the electrically conductive protective layer 14 extends across the entire substrate surface. As a result, the device in this state is electrically inoperative since the protective layer 14 essentially shorts the entire set of devices. Accordingly, it is necessary to remove those portions of the protective layer 14 which do not lie directly under the electrodes 18 (see FIG. 3). This is accomplished using etching procedures that are known in the art, such as reactive ion etching recipes that employ fluorine or chlorine gases as etchant molecules. Such etching procedures will possibly remove any molecules located under the protective layer that is being removed. It is important that the etching conditions be controlled so that the lower electrodes 12, the top electrodes 18, and the molecules 13 and conductive material 14 sandwiched between the two electrodes are not significantly damaged during the etching process. Damaging the electrodes or the remaining sandwiched molecules or conductive material can destroy or otherwise alter device performance. For example, a severely thinned lower electrode can greatly increase the measured device resistance. Many etching recipes will lead to severe undercut of the lower electrode, and, while minor undercut may be acceptable, severe undercut is to be avoided.

As can be seen from the preceding description, the method of the present invention is well-suited for forming electrode patterns using conventional lithographic and other patterning techniques wherein the second electrode pattern is formed onto the protective metal layer's upper surface rather than the more sensitive underlying molecular switching layer.

Examples of practice are as follows:

In the following examples, the method of the present invention was used to fabricate isolated molecular-based switching tunnel junctions, molecular-switch-based 16-bit random access memory circuits. For all devices demonstrated, the molecular thin film was a single molecule thick film, i.e., a molecular monolayer.

Figure 5:
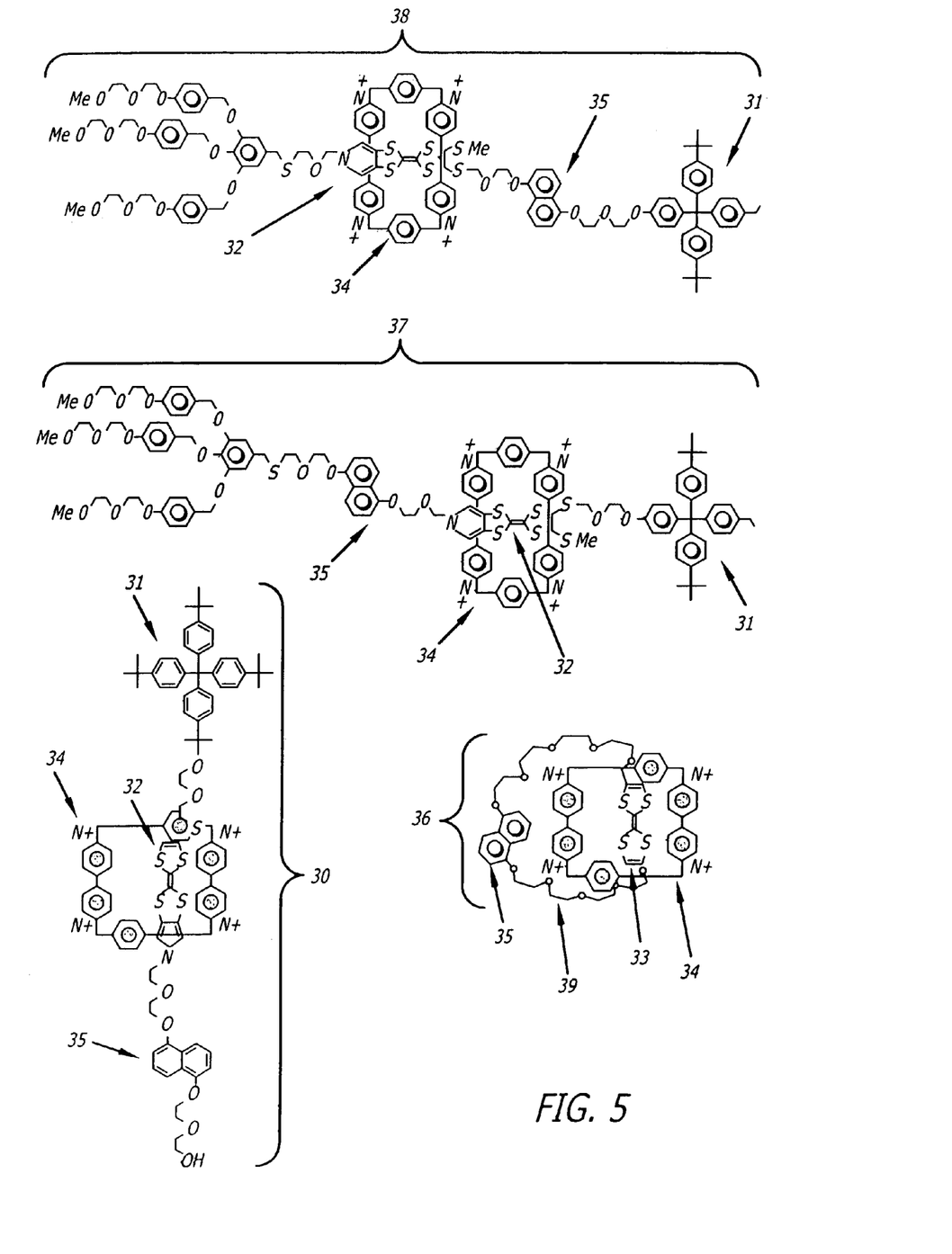
FIG. 5 shows the chemical structures of exemplary bistable molecules.

The molecular thin films that were used to demonstrate this invention were fabricated from the switching molecules 37, 38. These switching molecules are bi-stable, and the switching mechanism is activated by the oxidation of the molecular complex. Other switching molecules 30, 36 are viable candidates as well, and come from the class of molecules known as pseudorotaxanes 30 and catenanes 36. In addition, other molecules that can be used to form the molecular layer include those which exhibit one of the following electrical characteristics: charge storage (capacitor), signal rectification (diodes), signal dissipation (resistors) or signal inversion (negative differential resistance).

Both switching molecules 37 and 38 come from the general class of molecules known as [2]rotaxanes. A [2]rotaxane is a molecule consisting of two interlocked molecular components. This particular [2]rotaxane is an amphiphile, meaning that the top 31 of this molecule is hydrophobic, while the bottom is hydrophilic. The two components of the [2]rotaxanes consist of a tetracationic cyclophane ring 34 encircling a dumbbell-shaped molecular component. The dumbbell-shaped component has two distinct recognition sites 32 and 35 that provide binding sites for the cyclophane ring 34. The bistability of these molecules is characterized by detailed chemical analysis of their dynamical properties in solution. At least some critical component of that bistable switching character has been demonstrated to also be observed in solid-state switching devices such as are presented here. Whether the cyclophane ring binds at site 32 or site 35 depends on the oxidation state of the entire [2]rotaxane molecular structure. The lowest energy state of [2]rotaxane 38 is the one in which the cyclophane ring 34 is associated with site 32. When the [2]rotaxane 38 is oxidized, an electron is removed from site 32, leaving a positive charge. The 4+ charged cyclophane ring 34 is repelled by this charge, and moves down the chain to sit at binding site 35. This bistability is the basis of the switching in this device. Other bistable switching molecules, known as [2]pseudorotaxanes 30, for example and [2]catenanes 36 for example, as well as spiropyrans, have also been used successfully as switching molecules in the literature (Collier, JACS, 2001; Collier, ChemPhysChem2001), although the switching mechanisms for the spiropyran molecules are different than for the other molecules described here.

The polycrystalline silicon thin films that were fashioned into bottom electrodes were fabricated according to a previously-described literature procedure (C. P. Collier, G. Mattersteig, Y. Li, E. W. Wong, K. Beverly, J. Sampaio, F. Raymo, J. F. Stoddart, and J. R. Heath, "A [2]-Catenane Based Solid-State Electronically Reconfigurable Switch," *Science*, 289, 1172–75 (2000)). This particular procedure leads to very smooth electrodes, which are ideal for supporting the transfer of a Langmuir Blodgett molecular monolayer film and minimizing defects in that film. The measured resistivity of the resultant n-doped polycrystalline silicon thin film was 0.02 ohms·cm.

Figure 4:
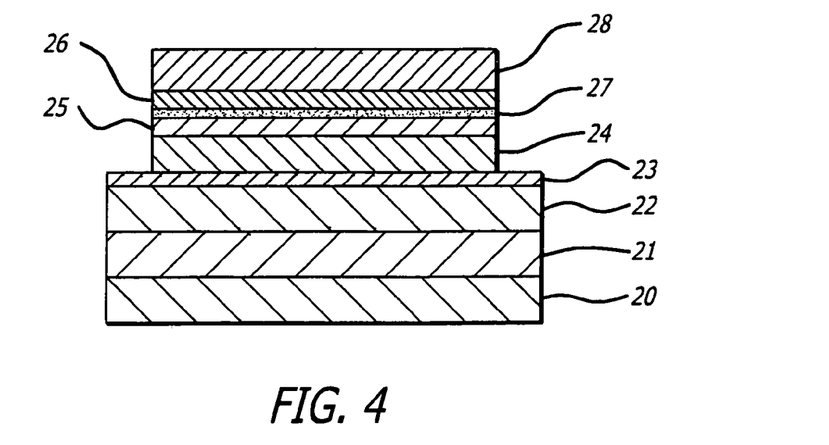
FIG. 4 is a diagram of a finished device stack.
Figure 6:
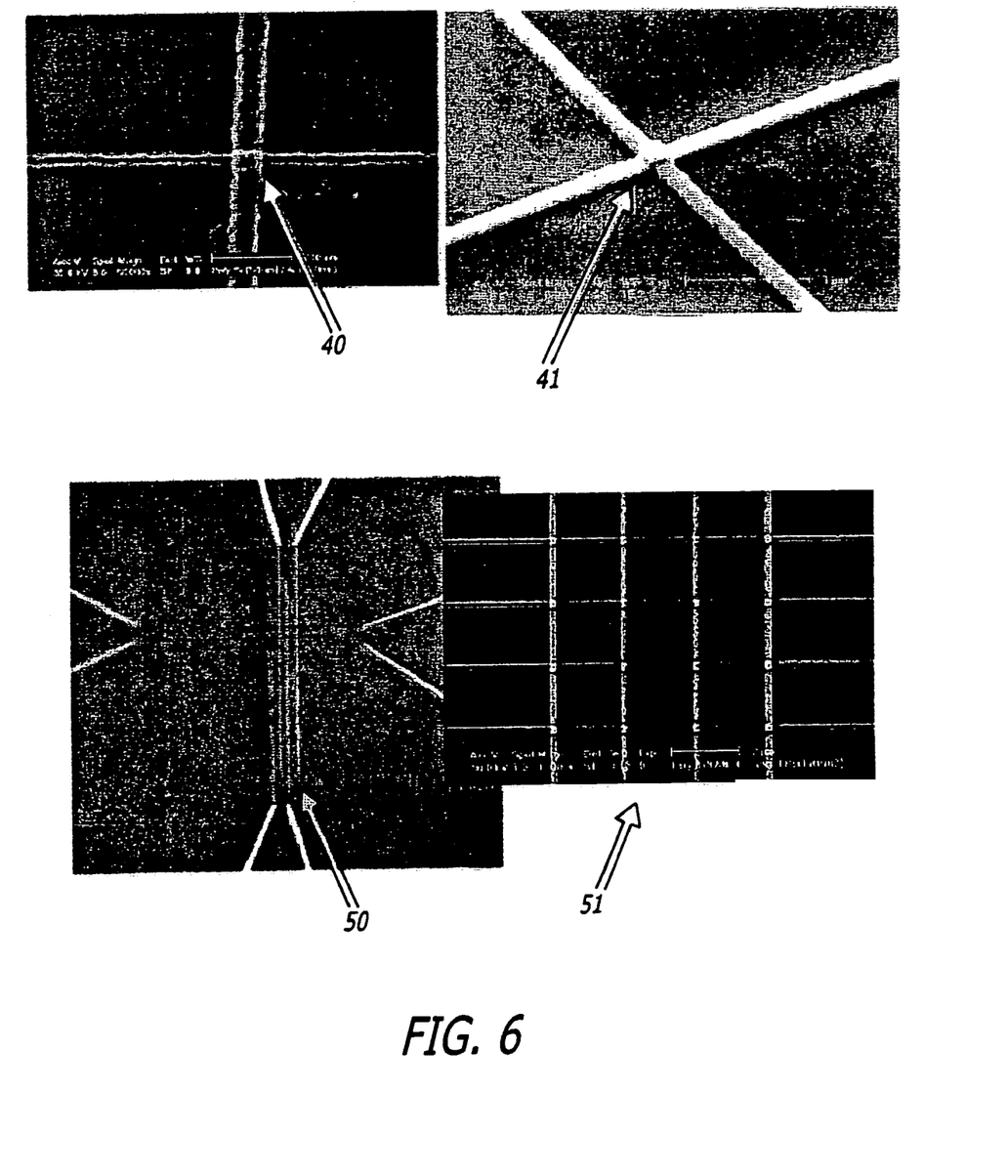
FIG. 6 shows micrographs of exemplary sub-micron-scale molecular switch tunnel junction devices fabricated according to the present invention.

Two sets of devices were prepared: Device Set I consisting of isolated devices 40 and crosspoint circuits 50 and Device Set II consisting of isolated devices 41 and crosspoint circuits 51 (see FIG. 6). Both sets of devices contained both isolated (single-junction) devices, as well as crosspoint memory circuits, fabricated on the same wafer. The processing techniques and materials components utilized for these two devices were similar, but not identical. Referring to FIG. 4, a silicon wafer 20 was coated with a 0.1 micrometer thick $SiO_2$ film 21 on top of which was grown the previously described polysilicon thin film 22. The polysilicon film was utilized with the 1 nanometer thick native $SiO_2$ layer 23. A Langmuir Blodgett molecular monolayer 24 made of either 38 (Device I) or 37 (Device II) was utilized as the switching component of the device. A titanium protective conducting layer 25 was used. This protective, upon exposure to air, forms a native 1 nanometer thick oxide at the top surface 26 that was not removed. The top electrodes were deposited with a thin titanium adhesion layer 27 followed by a thicker Al top electrode (Device I) or a thicker nickel top electrode (Device II). The detailed preparation of these devices is as follows:

Bottom electrodes were patterned from polycrystalline silicon thin film using the following procedure.
 a. Spin coat PMMA on n-doped poly-silicon wafer.
  4000 rpm for 45 seconds with 4% 950 PMMA in chlorobenzene
 b. Bake for 20 minutes on hot plate at 180° C.
  E-beam write bottom electrode pattern 400 $\mu C/cm^2$ area dose
  Develop pattern in methylisobutylketone:isopropanol (MIBK:IPA), 1:3 for 60 seconds, 10 seconds in IPA, rinse with water and dry with inert gas
 c. Evaporate metal in electron-beam evaporator, 500' aluminum
 d. Lift-off PMMA/aluminum in acetone overnight
 e. RIE: $CF_4:O_2$, 5:1, 200 Watts for approximately 30 seconds (down to oxide layer)
 f. Remove aluminum with PAE (phosphoric acid etchant) at 50° C. for 2 minutes Deposition of molecular monolayer and titanium protective layer
 a. Clean the wafer with commercial (Aleg-brand) cleaner for 30 minutes at 85° C.
 b. Distill chloroform from basic alumina
 c. Clean the Langmuir trough, use buffered aqueous subphase ($4.87 \times 10^{-4}$ $Na_2CO_3/NaHCO_3$ subphase starting from 18 MegaOhm, high purity water). The buffered subphase is necessary for the particular molecules that were used, but it is, in general, not a requirement. The particular molecules (38 for Device I; 37 for Device II) used had some functional components that could be oxidized by the combined exposure of the molecule to air and acid. An untreated, high purity aqueous subphase will be acidic, and so the high-pH is designed to protect those particular molecules.
 d. Deposit molecule/chloroform solution to a pressure of approximately 1 mN/m
 e. Compress to 30 mN/m pressure (as measured by using the Wilhelmy balance of the Langmuir trough according to standard techniques) in the following steps:
  1–2 mN/m at 10 $cm^2$/min compression rate
  2–15 mN/n at 5 $cm^2$/min compression rate
  15–30 mN/m at 2 $cm^2$/min compression rate
  Allow to equilibrate at 30 mN/m for a few minutes
 f. Raise sample at 1 mm/min to transfer Langmuir monolayer as a Langmuir-Blodgett film (16) on top of the electrodes.
 g. Put wafer into vacuum chamber and evacuate for a few minutes to remove at least most of the water.
 h. Deposit 100' titanium (e-beam evaporation) as protective layer The following steps are the ones used to lithographically define and deposit the top electrode, and then to develop that electrode pattern and remove the protective metallic film that is not protected by the top electrode pattern.
 a. Spin coat PMMA (poly-methylmethacrylate) film (17) on n-doped poly-silicon wafer. 4000 rpm for 45 seconds with 4% 950 PMMA in chlorobenzene
 b. Bake at 100° C. for 12 hours
 c. E-beam write top electrode pattern, 550 micro Coulombs/$cm^2$ area dose
 d. Develop pattern in MIBK:IPA (methylisobutylketone: isopropanol), 1:3 for 60 seconds, 10 seconds in IPA, rinse with water and dry with inert gas
 e. Evaporate top electrode metals, 50' Ti/1000' Al (device I) or 50' Ti/750' Ni (Device II).
 f. Lift off un-patterned PMMA in acetone for 1 hour.

g. It is now necessary to remove the buffer layer of metal, as this layer will actually short all of the devices together. This layer must be removed selectively, without removing the top electrode or bottom electrode materials.

h. Use reactive ion etching (RIE) with a chlorine ($Cl_2$) plasma to remove Ti protective layer (Device I). Use reactive ion etching (RIE) and a fluorine plasma to remove metallic protective layer (Device II).

i. The single devices etched by the fluorine plasma (40) or by the chlorine plasma (41) RIE process are now ready for testing.

j. The crossbar memory circuits etched by the fluorine (50) or chlorine (51) plasma RIE process are now ready for testing.

k. The conditions for the fluorine plasma etch were: (35 SCCM (standard cubic centimeters per minute) $CF_4$; 3 SCCM $O_2$; 0.15 Torr, 200 Watts power; 60 to 90 seconds).

l. The conditions for the chlorine plasma etch were: $Cl_2$ gas at 2 milliTorr pressure and 5 SCCM flow rate; Temperature=300 Kelvin; 80 Watts power; 150 second etch time with endpoint detection using the reflected light of a helium neon laser.

Devices containing molecules 37, 38 were all fabricated in order to demonstrate switching devices based on this invention. Circuits containing molecules 37, 38 were fabricated in order to demonstrate crosspoint memory circuits based on the present invention. All device measurements were carried out under standard laboratory conditions (room temperature, room pressure and an air environment).

Figure 7:
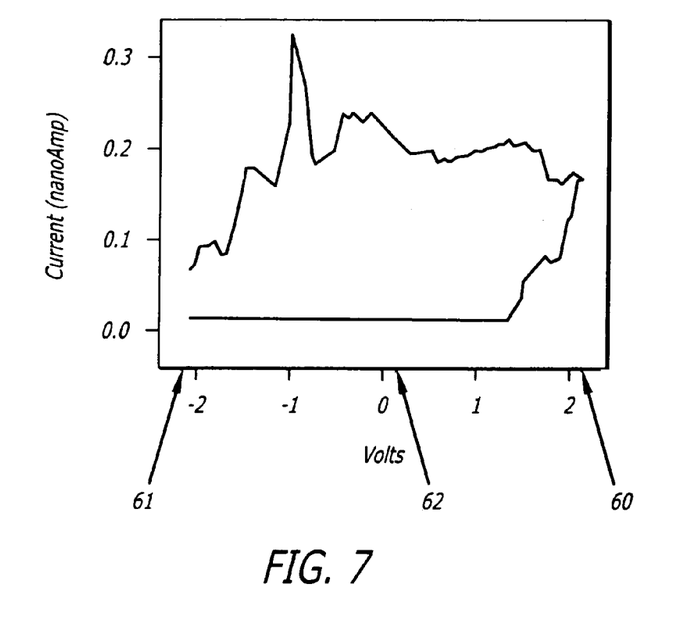
FIG. 7 is a graph showing the remnant molecular signature (hysteresis loop) of an exemplary molecular electronic device in accordance with the present invention.
Figure 8:
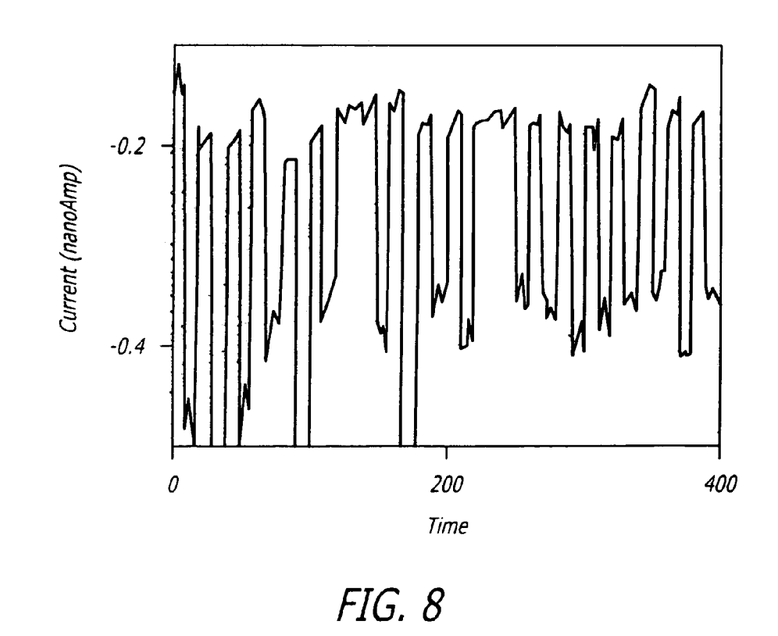
FIG. 8 is a graph showing several cyclings of an exemplary molecular electronic device through its hysteresis loop.
Figure 9:
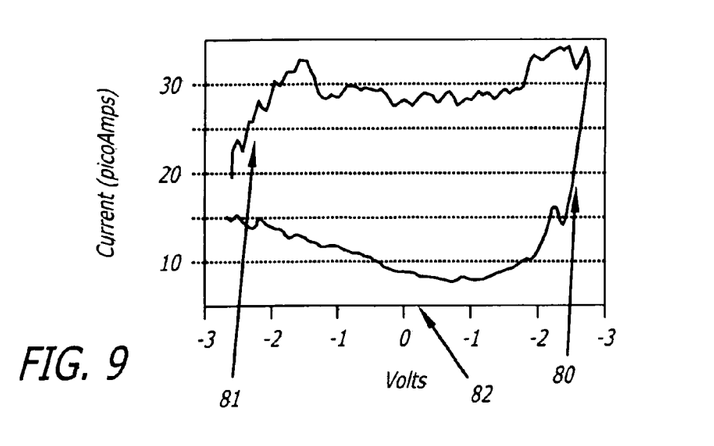
FIG. 9 is a graph showing the remnant signature (hysteresis loop) of an exemplary molecular electronic device in accordance with the present invention.
Figure 10:
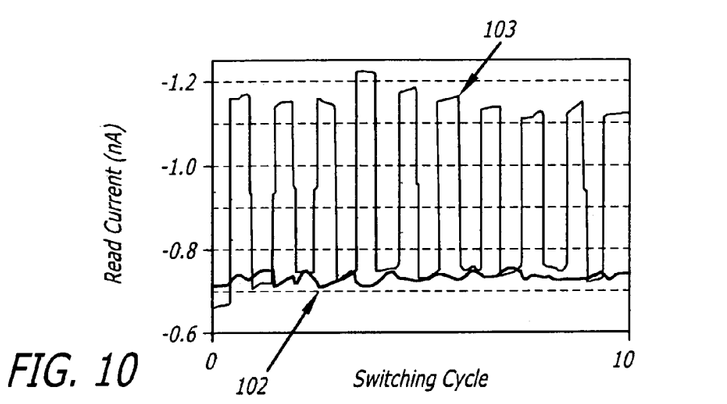
FIG. 10 is a graph showing several cyclings of an exemplary molecular electronic device, as well as a control (non-switching) device, that was fabricated in accordance with the present invention.

The invention was further demonstrated using molecular switch tunnel junctions fabricated in a sandwich-type configuration, and using electron-beam lithography to fabricate devices that had electrode intersections or active areas (the region where the electrodes overlap) of 0.01 to 0.0025 micrometers squared. The devices were fabricated using either n-doped polycrystalline silicon bottom electrodes, passivated with the native (1 nanometer thick) $SiO_2$ layer, and a Ti protection layer on top of the molecular thin film. Note that during the process in which the polysilicon bottom electrode was lithographically defined, an aluminum film was deposited on top of that electrode to protect it from the etching process so that the rest of the polysilicon thin film could be removed. Energy dispersed x-ray analysis of the film was carried out to interrogate whether or not any aluminum remained on top of this electrode after the processing was complete and the aluminum removed. No aluminum was found, but trace amounts may have remained that were below the detectable limit. As a set of control experiments, 0.01 micrometer squared isolated devices were also fabricated in accordance with the invention using eicosanoic acid ($C_{20}H_{43}CO_2H$) as the molecular monolayer. Eicosanoic acid is not expected to yield any type of switching signature, and those devices did not yield any type of switching signature. These devices did yield a current-voltage response that indicated that the eicosanoic acid was acting as a tunnel barrier to current flow, implying that the eicosanoic acid monolayer survived the processing steps intact, and that the switching characteristics of the switching devices presented here originate from a molecular property and not from some artifact of the device fabrication processing. The electrical properties of this device are measured by connecting the bottom electrode to a voltage source, and the top electrode to a current amplifier measuring device. The operational characteristics of this device are best quantified by measuring the capacitance-free hysteretic response of the device. If the device is an operating molecular switch tunnel junction device, then the hysteresis of the device indicates the voltages at which the switch may be closed, opened, and read. In order to measure the capacitance-free hysteresis of the device, an experiment similar to what is called a remnant polarization measurement in ferroelectric switching devices is carried out. (R. E. Jones, Jr., et al., "Ferroelectric non-volatile memories for low-voltage, low-power applications," *Thin Solid Films,* 270, 584–588 (1995).) For molecular switch tunnel junction devices, this is called a measurement of the remnant molecular signature. In such a measurement, a ramped series of voltage pulses is applied across the two electrodes. For example, the voltage pulses might follow the series (−2.0V, −1.95V, −1.9V . . . 0.0V . . . +1.95V, +2.0V, +1.95V . . . −1.95V, −2.0V). After each voltage pulse, a small bias (+0.1V, for example) is applied across the two electrodes, and the current is measured. In this way, the effect of perturbing the device by applying a voltage is probed at a small, non-perturbing voltage in such a way that the measurement is insensitive to the capacitance of the device. Such a measurement (FIG. 7 for Device I, FIG. 9 for Device II) reveals the hysteretic molecular signature of this device and indicates successful fabrication and operation of the device. The remnant molecular signature can be utilized to identify the voltages necessary for closing (Vclose) 60, 80, opening (Vopen) 61, 81, or reading (Vread) 62, 82 the state of the device (see FIGS. 7 and 9). Once these voltages are known, then a second measurement in which the device is cycled between the open and closed states can be performed (see FIG. 8 for Device I and FIG. 10 for Device II). In these measurements, the device is opened applying Vopen, and the state of the device is read for a few seconds by monitoring the current through the device at Vread. The device is then closed by applying Vclose, and the state of the device is again read for a few seconds by monitoring the current at Vread. This is done several times so the cycling of the device through open and close cycles can be monitored. Control devices made in an identical fashion as Device II, but using eicosanoic acid ($C_{19}H_{39}CO_2H$), as non-switching molecule, yielded no switching signature 102. However, when the switching molecule 30 was used, a switching response was observed 103. This indicates that the molecular switching properties survived the device fabrication process.

This device and its operational characteristics are advantageous in the following way. If electrodes were evaporated through a separate shadow mask, the width of the electrodes would be limited to a micrometer or so, and the 100 nanometer wide and smaller electrodes used here would not be possible.

Figure 11:
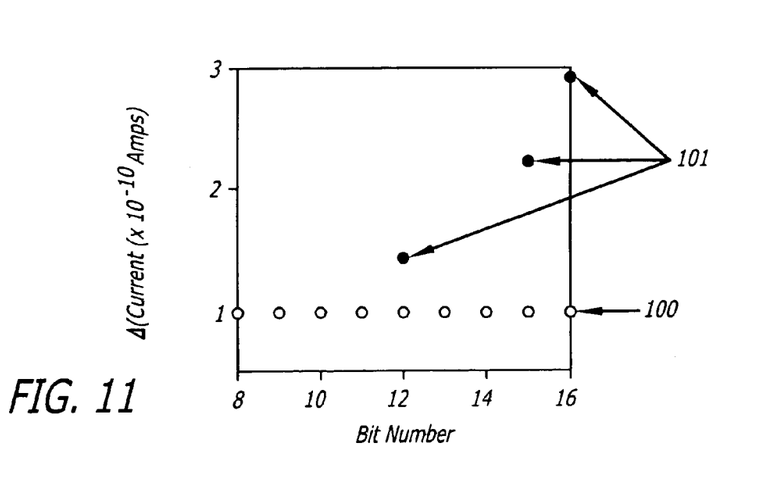
FIG. 11 the operation of 3-bits of an exemplary molecular switch tunnel junction crosspoint memory circuit containing 16 individual devices in accordance with the present invention.

As previously mentioned, this invention was also reduced to practice by fabricating 16-bit crosspoint memory circuits 50, 51. In order to test the memory, connections to each of the individual wires were made, and a relay circuit was employed to apply voltage, monitor current, ground, or otherwise electrically connect each of the wires separately. The electrical properties of the memory are illustrated in FIG. 11. All molecular switches were electrically set to their open state 100, and a voltage was applied across certain of the bits 101 so that those bits were set to the switch-closed state. The current was then monitored through those bits, and it was found that the switches had closed (current through the bits had increased). Switching molecule 38 was used for this memory.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the above preferred embodiments and examples, but is only limited by the following claims.

What is claimed is:

1. A method for making a molecular electronic device comprising the steps of:
   providing a substrate comprising a surface on which is located a first electrode pattern;
   depositing molecules having an electrical characteristic onto said substrate surface to form a molecular layer which covers said substrate surface including said first electrode pattern;
   depositing an electrically conductive material onto said molecular layer to form an electrically conductive protective layer having an exposed surface;
   forming a second electrode pattern on the exposed surface of said protective layer wherein said second electrode pattern overlaps said first electrode pattern to form at least one electrode intersection; and
   removing said protective layer at locations which remain exposed after formation of said second electrode pattern to form at least one electrode intersection wherein said molecular layer and electrically conductive protective layer are sandwiched between said first and second electrodes.

2. A method for making a molecular electronic device according to claim 1 wherein said electrical characteristic of said molecules is bistable switching.

3. A method for making a molecular electronic device according to claim 1 wherein said step of forming said second electrode pattern on the exposed surface of said electrically conductive protective layer comprises the steps of:
   forming a mask layer covering said electrically conductive protective layer;
   removing a sufficient portion of said mask layer to form an electrode location on said electrically conductive protective layer; and
   depositing electrode material onto said electrode location to form said second electrode pattern on said protective layer.

4. A method for making a molecular electronic device according to claim 1 wherein said molecule is a bistable switching molecule or a molecule exhibiting differential resistance selected from the group consisting of [2]rotoxanes, [2]catenanes, spiropyrans, and [2]pseudorotaxanes.

5. A method for making a molecular electronic device according to claim 1 wherein said electrically conductive material which is used to form said protective layer is selected from the group of metals consisting of titanium and chromium.

6. A method for making a molecular electronic device according to claim 1 wherein said molecular layer is a Langmuir monomolecular layer.

7. A method for making a molecular electronic device according to claim 1 wherein said first and second electrode patterns are made from a metal selected from the group consisting of aluminum, gold, silver, cobalt, iron, nickel, tin, copper, platinum, palladium, and alloys thereof.

8. A method for making a molecular electronic device according to claim 1 wherein said first and second electrode patterns are made from a material selected from the group consisting of silicon, polysilicon, amorphous silicon, gallium arsenide and electrically conducting doped polymers.

9. A method for making a molecular electronic device according to claim 1 wherein said device comprises molecular switch tunnel junctions, molecular switch cross-point memories, molecular switch logic circuits or molecular-based resonant tunnel diodes which exhibit negative differential resistance.

10. A method for making a molecular electronic device according to claim 1 wherein said electrically conductive protective layer is removed by either wet etching or dry etching.

11. A method for making a molecular electronic device according to claim 1 wherein said second electrode pattern is formed using either electron or photon lithography.

12. A method for making a molecular electronic device according to claim 1 wherein said second electrode pattern is formed via either a stamping or imprinting technique.

13. A molecular electronic device or circuit made according to the method of claim 1.

* * * * *